United States Patent
Saito (10) Patent No.: US 7,515,499 B2
(45) Date of Patent: Apr. 7, 2009

(54) SEMICONDUCTOR MEMORY DEVICE EQUIPPED WITH STORAGE SECTION FOR STORING SETTING INFORMATION TO SET INITIAL OPERATION AND FUNCTION

(75) Inventor: Hidetoshi Saito, Yamato (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 9 days.

(21) Appl. No.: 11/609,476

(22) Filed: Dec. 12, 2006

(65) Prior Publication Data

US 2007/0133290 A1 Jun. 14, 2007

(30) Foreign Application Priority Data

Dec. 13, 2005 (JP) .............................. 2005-359377

(51) Int. Cl.
*G11C 8/00* (2006.01)
(52) U.S. Cl. .............................. 365/230.03; 365/185.09; 365/185.11
(58) Field of Classification Search ............ 365/230.03, 365/185.09, 185.11
See application file for complete search history.

(56) References Cited

U.S. PATENT DOCUMENTS 6,377,502 B1 * 4/2002 Honda et al. ........... 365/230.03
6,462,985 B2 * 10/2002 Hosono et al. .......... 365/185.09
6,970,388 B2    11/2005 Takeuchi et al.

FOREIGN PATENT DOCUMENTS

JP      10-302476      11/1998
JP      2001-176290    6/2001

* cited by examiner

*Primary Examiner*—Hoai V Ho
*Assistant Examiner*—Fernando N Hidalgo
(74) *Attorney, Agent, or Firm*—Oblon, Spivak, McClelland, Maier & Neustadt, P.C.

(57) ABSTRACT

A device includes first and second memory cell arrays, first and second decoders, first and second sense amplifiers, and first and second switch circuits. The first switch circuit switches the supply of writing and erasing voltages or a reading voltage to the first memory cell array, and switches the supply of writing and erasing addresses or a reading address to the first decoder, and switches the connection of a data line connected to the first memory cell array to the first sense amplifier. The second switch circuit switches the supply of writing and easing voltages or a reading voltage to one of the second memory cell arrays, and switches the supply of writing and erasing addresses or a reading address to one of the second decoders, and switches the connection of a data line connected to the second memory cell arrays to the second sense amplifier.

8 Claims, 5 Drawing Sheets

SEMICONDUCTOR MEMORY DEVICE EQUIPPED WITH STORAGE SECTION FOR STORING SETTING INFORMATION TO SET INITIAL OPERATION AND FUNCTION

CROSS-REFERENCE TO RELATED APPLICATIONS

This application is based upon and claims the benefit of priority from prior Japanese Patent Application No. 2005-359377, filed Dec. 13, 2005, the entire contents of which are incorporated herein by reference.

BACKGROUND OF THE INVENTION

1. Field of the Invention

The present invention relates to a semiconductor memory device, e.g., a NOR type flash memory equipped with a storage section for storing setting information to set an initial operation or a function.

2. Description of the Related Art

A semiconductor memory device such as a NOR type flash memory usually includes a storage section for storing setting information to set an initial operation and a function (e.g., Jpn. Pat. Appln. KOKAI Publication No. 10-302476).

Conventionally, in the storage section disposed in the NOR type flash memory to store setting information, one memory cell has been installed in one bit line, and a memory cell array has been configured by a small capacity unit of about 10 bits in many cases. A decoder and a sense amplifier have been arranged in each memory cell.

In such a NOR type flash memory, as a memory capacity is enlarged, the amount of setting information such as redundancy information or protect information for protecting data to replace a defective memory cell with a redundant memory cell increases, and a memory capacity of the storage section for storing the information also increases. The increased memory capacity of the storage section increases the number of decoders, sense amplifiers or the like for reading the setting information from the storage section. In consequence, the increase in the number of decoders or sense amplifiers of the storage section for storing the setting information has caused a problem of an increase in chip area.

BRIEF SUMMARY OF THE INVENTION

According to a first aspect of the present invention, a semiconductor memory device includes a first memory cell array which includes a plurality of memory cells, a first decoder which selects the memory cell from the first memory cell array based on address, a second memory cell array which includes a plurality of memory cells, a second decoder which selects the memory cell from the second memory cell array based on address, a first sense amplifier which erases, writes and reads data from, to and from the memory cell selected by one of the first decoder and the second decoder, a first switch circuit which switches the supply of writing and erasing voltages or a reading voltage to the first memory cell array, the first switch circuit switching the supply of writing and erasing addresses or a reading address to the first decoder, and switching the connection of a data line connected to a bit line of the first memory cell array to the first sense amplifier, a second switch circuit which switches the supply of writing and erasing voltages or a reading voltage to the second memory cell array, the second switch circuit switching the supply of writing and erasing addresses or a reading address to the second decoder, and switching the connection of a data line connected to a bit line of the second memory cell array to the first sense amplifier, a plurality of third memory cell arrays each of which includes pluralities of word and bit lines, and a plurality of memory cells arranged in a matrix at intersections of the word and bit lines, the plurality of third memory cell arrays storing setting information to set an initial operation and a function when power is turned ON, a plurality of third decoders which select the memory cells from the plurality of third memory cell arrays based on a predetermined signal output when the power is turned ON, a second sense amplifier which reads the setting information from the memory cells selected by the plurality of third decoders, a third switch circuit which switches the supply of writing and erasing voltages or a reading voltage to one of the plurality of third memory cell arrays, the third switch circuit switching the supply of writing and erasing addresses or a reading address to one of the plurality of third decoders, and switching the connection of a data line connected to a bit line of one of the plurality of third memory cell arrays to the second sense amplifier, a latch circuit which stores the setting information read by the second sense amplifier, and a control circuit which sets the initial operation and the function in accordance with the setting information stored in the latch circuit.

According to a second aspect of the present invention, a semiconductor memory device includes a first memory cell array which includes a plurality of memory cells, a first decoder which selects the memory cell from the first memory cell array based on address, a second memory cell array which includes a plurality of memory cells, a second decoder which selects the memory cell from the second memory cell array based on address, a plurality of third memory cell arrays each of which includes pluralities of word and bit lines, and a plurality of memory cells arranged in a matrix at intersections of the word and bit lines, the plurality of third memory cell arrays storing setting information to set an initial operation and a function when power is turned ON, a plurality of third decoders which select the memory cells from the plurality of third memory cell arrays based on a predetermined signal output when the power is turned ON, a sense amplifier which reads data from the memory cell selected by one of the first and second decoders, and the setting information from the memory cells selected by the plurality of third decoders, a first switch circuit which switches the supply of writing and erasing voltages or a reading voltage to the first memory cell array, the first switch circuit switching the supply of writing and erasing addresses or a reading address to the first decoder, and switching the connection of a data line connected to a bit line of the first memory cell array to the sense amplifier, a second switch circuit which switches the supply of writing and easing voltages or a reading voltage to one of the plurality of second and third memory cell arrays, the second switch circuit switching the supply of writing and erasing addresses or a reading address to one of the plurality of second and third decoders, and switching the connection of a data line connected to a bit line of one of the plurality of second and third memory cell arrays to the sense amplifier, a latch circuit which stores the setting information read from the plurality of third memory cell arrays by the sense amplifier, and a control circuit which sets the initial operation and the function in accordance with the setting information stored in the latch circuit.

DETAILED DESCRIPTION OF THE INVENTION

Semiconductor memory devices of the preferred embodiments of the present invention will be described below with reference to the accompanying drawings. A NOR type flash memory will be taken as an example. For explanation, throughout the drawings, similar sections will be denoted by similar reference numerals.

FIRST EMBODIMENT

First, a NOR type flash memory of a first embodiment of the present invention will be described.

Figure 1:
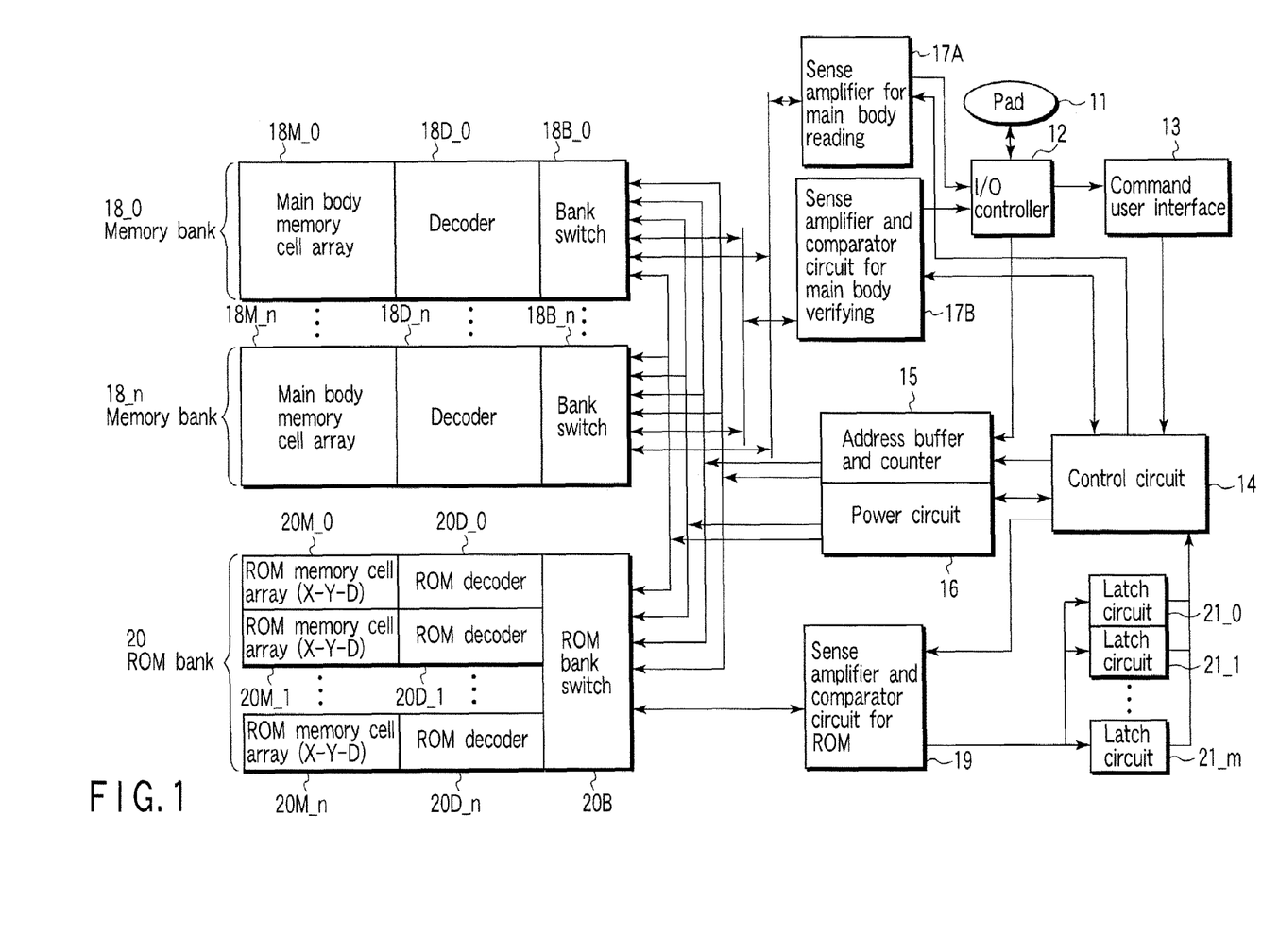
FIG. 1 is a block diagram showing a configuration of a NOR type flash memory according to a first embodiment of the present invention.

FIG. 1 is a block diagram showing a configuration of the NOR type flash memory of the first embodiment.

This NOR type flash memory includes a pad 11, an I/O controller 12, a command user interface 13, a control circuit 14, an address buffer and counter 15, a power circuit 16, a sense amplifier 17A for main body reading, a sense amplifier and comparator circuit 17B for main body verifying, memory banks 18_$n$ (n=0, 1, ..., n), a sense amplifier and comparator circuit 19 for a ROM, a ROM bank 20, and latch circuits 21_$m$ (m=0, 1, ..., m).

The memory banks 18_0, ..., 18_$n$ respectively include main body memory cell arrays 18M_0, ..., 18M_n, decoders 18D_0, ..., 18D_n, and bank switches 18B_0, ..., 18B_n. The ROM bank 20 includes ROM memory cell arrays 20N_0 (X-Y-D), ..., 20M_n (X-Y-D), ROM decoders 20D_0, ..., 20D_n, and a ROM bank switch 20B.

An address, data, a power source, and various commands are entered to the pad 11. The I/O controller 12 controls inputting/outputting of signals such as the data input via the pad 11, or the address, the power source and various commands input via the pad 11. The command user interface 13 determines a command based on a signal input from the I/O controller 12, and outputs a control signal indicting the command to the control circuit 14.

The control circuit 14 receives the control signal from the command user interface 13 to control an operation of the address buffer and counter 15, the power circuit 16, the sense amplifier 17A for main body reading, the sense amplifier and comparator circuit 17B for main body verifying, the sense amplifier and comparator circuit 19 for the ROM, or the like. The address buffer and counter 15 stores addresses output from the I/O controller 12, and counts the addresses. The power circuit 16 generates a writing voltage of writing time and an erasing voltage of erasing time, or a reading voltage of reading time to supply them to the memory banks 18_0 to 18_$n$ and the ROM bank 20.

The sense amplifier 17A for main body reading reads data stored in the main body memory cell arrays 18_0 to 18M_n. The sense amplifier of the sense amplifier and comparator circuit 17B for main body verifying reads the data stored in the main body memory cell arrays 18_0 to 18M_n for verifying. The comparator circuit of the sense amplifier and comparator circuit 17B for main body verifying compares the data read from the main memory cell arrays 18_0 to 18M_n with an expected value, and outputs a result of the comparison to the control circuit 14. The sense amplifier of the sense amplifier and comparator circuit 19 for the ROM reads data stored in the ROM memory cell arrays 20M_0 to 20M_n. The comparator circuit of the sense amplifier and comparator circuit 19 compares the data read from the ROM memory cell arrays 20M_0 to 20M_n with an expected value, and outputs a result of the comparison to the control circuit 14. Additionally, the latch circuits 21_0 to 21_$m$ store data read from the ROM memory cell arrays 20M_0 to 20M_n to output them to the control circuit 14.

The decoders 18D_0, ..., 18D_n, and the bank switches 18B_0, ..., 18B_n are respectively connected to the main body memory cell arrays 18M_0, ..., 18M_n. Each of the main body memory cell arrays 18M_0 to 18M_n includes a plurality of NOR type memory cells arranged in a matrix. Each of the NOR type memory cells includes a nonvolatile memory having control and floating gates, and enables writing and erasing (rewriting). The decoders 18D_0 to 18D_n decode addresses output from the address buffer and counter 15, and select memory cells specified by the addresses from the main body memory cell arrays 18M_0 to 18M_n. The bank switches 18B_0 to 18B_n switch the supply of the writing and erasing voltages or the reading voltage from the power circuit 16 to the main body memory cell array 18M_n. The bank switches 18B_0 to 18B_n switch the supply of writing and erasing addresses or a reading address output from the address buffer and counter 15 to the decoders 18B_0 to 18B_n. Further, the bank switches 18B_0 to 18B_n switch the connection of a data line connected to a bit line in the main body memory cell array to the sense amplifier 17A for main body reading or the sense amplifier and comparator circuit 17B for main body verifying.

The ROM decoders 20D_0, ..., 20D_n are connected to the ROM memory cell arrays 20M_0 (X-X-D), ..., 20M_n (X-Y-D), and the ROM bank switch 20B is connected to these decoders. Each of the ROM memory cell arrays 20M_0 (X-Y-D) to 2OM_n (X-Y-D) includes a plurality of NOR type memory cells arranged in a matrix. Each of the NOR type memory cells includes a nonvolatile memory cell having control and floating gates, and enables writing and deleing (rewriting). The ROM memory cell arrays 20M_0 (X-Y-D) to 20M_n (X-Y-d) store setting information necessary for setting an initial operation and a function when power is turned ON or the like, e.g., redundant information for replacing a defective memory cell with a redundant memory cell or protect information for protecting data. X denotes the number of word lines, Y denotes the number of bit lines, and D denotes the number of data lines.

The ROM decoders 20D_0 to 20D_n select decode addresses output from the address buffer and counter 15, and select memory cells specified by the addresses from the ROM memory cell arrays 20M_0 (X-Y-D) to 20M_n (X-Y-D). The ROM decoders 20D_0 to 20D_n decode predetermined signals when power is turned ON, and select memory cells specified by the predetermined signals from the ROM memory cell arrays 20M_0 (X-Y-D) to 20M_n (X-Y-D). The bank switch 20B switches the supply of the writing and erasing voltages or the reading voltage from the power circuit 16 to the ROM memory cell arrays 20M_0 (X-Y-D) to 20M_n (X-Y-D). The bank switch 20B switches the supply of the writing and erasing addresses or the reading address output from the address buffer and counter 15 to the ROM decoders 20D_0 to 20D_n. Further, the bank switch 20B switches the connection of the data line connected to the bit line in the ROM memory cell array to the sense amplifier and comparator circuit 19 for the ROM.

Figure 2:
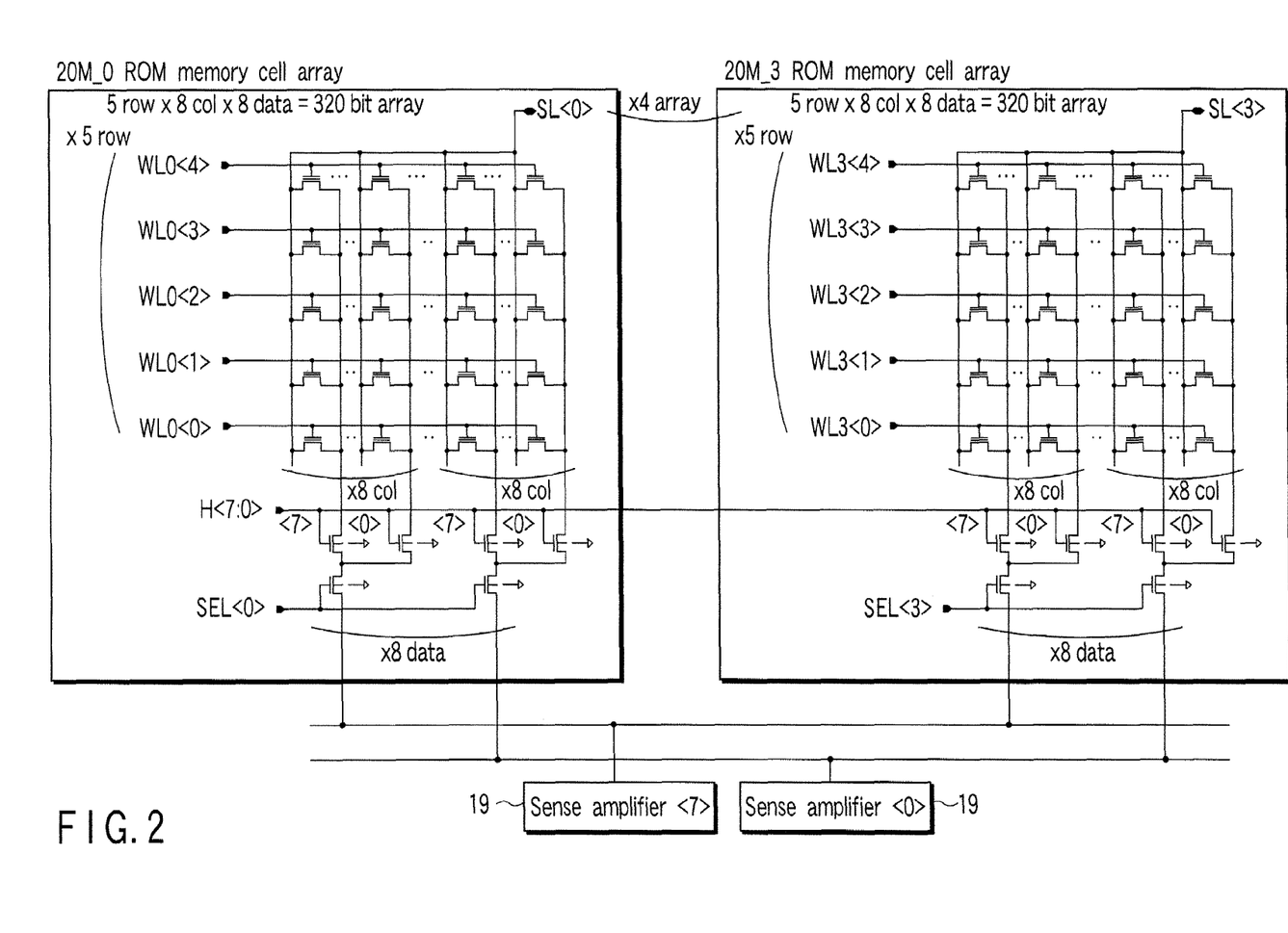
FIG. 2 is a circuit diagram showing a configuration of a ROM memory cell array in the NOR type flash memory of the first embodiment.

FIG. 2 is a circuit diagram showing a configuration of the ROM memory cell array in the NOR type flash memory of the first embodiment. A case in which the NOR type flash memory includes four ROM memory cell arrays is shown.

As shown in FIG. 2, each of the ROM memory cell arrays 20M_0 to 20M_n includes NOR type memory cells MC of 320 bits (=X×Y×D=5 rows×8 columns×8 data) arranged in a matrix. Each memory cell MC includes a nonvolatile memory cell having control and floating gates, and enables writing and erasing (rewriting).

Bit lines BL <0> to BL <7> are connected to drains of the memory cells MC arranged in the matrix. These bit lines are connected to the sense amplifier 19 via select transistors TH <0> to TH <7> and TS <0>. A source line SL <0> is connected to sources of the memory cells MC arranged in the matrix. Word lines WL 0 <0> to WL 0 <4> are connected to the control gates of the memory cells MC arranged in the matrix. As in the case shown in FIG. 2, each of the main body memory cell arrays 18M_0 to 18M_n include NOR type memory cells arranged in a matrix.

Figure 3:
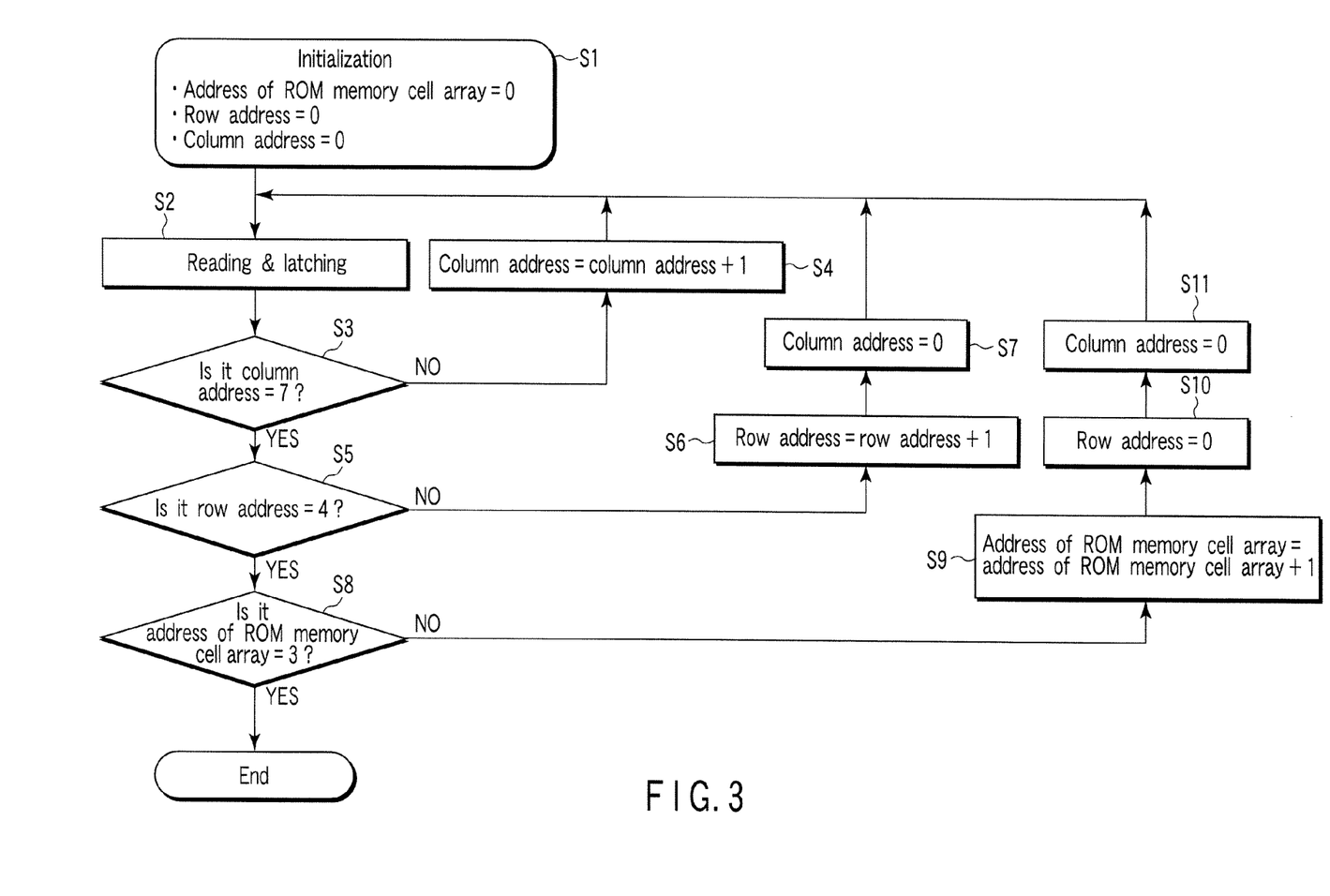
FIG. 3 is a flowchart showing a reading operation from the ROM memory cell array in the NOR type flash memory of the first embodiment.

Next, a reading operation from the ROM memory cell in the NOR type flash memory of the first embodiment will be described. FIG. 3 is a flowchart showing a reading operation from the ROM memory cell arrays 20M_0, . . . , 20M_3 in the NOR type flash memory.

When power is turned ON, by using a power-ON reset signal as a trigger, the power circuit 16 generates a reading voltage (word line voltage) used for reading from the ROM memory cell array 20M_n. After the word line voltage is stabilized, the power circuit 16 sends a reading permission signal to the control circuit 14.

The control circuit 14 resets the address buffer and counter 15 to select the ROM memory cell array 20M_0. It is presumed that each of the ROM memory cell arrays 20M_0, . . . , 20M_3 includes X (5) word lines (row), Y (8) bit lines (column), and D (8) (8 bits) data lines. Row and column addresses are both initial addresses (0) (step S1).

Subsequently, D pieces of bit information are read from a head address. The read pieces of bit information are latched in registers corresponding to X (5)×Y (8) included by the latch circuits 21_0 to 21_m after a passage of internally set reading time (step S2).

Determination is made as to whether a column address is "7" (step S3). If the column address is not "7", the column address is incremented (step S4), and the process returns to the step S2 to perform reading and latching operations again. Then, incrementing, reading and latching operations of the column address are repeated until the column address becomes "7".

Next, when the column address becomes "7", determination is made as to whether a row address is "4" (step S5). If the row address is not "4", the row address is incremented (step S6). Setting the column address to an initial address (0) (step S7), the process returns to the step S2 to perform reading and latching operations again. Then, incrementing of the row address, initializing of the column address, and reading and latching operations are repeated until the row address becomes "4".

Then, when the row address becomes "4", determination is made as to whether the ROM memory cell array is "3" (step S8). If the ROM memory cell array is not "3", the ROM memory cell array is incremented (step S9). Setting the column and row addresses to initial addresses (0) (steps S10, S11), the process returns to the step S2 to perform reading and latching operations again. When the ROM memory cell array becomes 3, the reading operation from the ROM memory cell array is finished.

In other words, first, the row and column addresses, and the ROM memory cell array are set to initial addresses to perform reading and latching operations. Subsequently, the row and column addresses are advanced by 1 to perform reading and latching operations again. This operation is repeated until the last row and column addresses and, when it is finished, the ROM memory cell array is advanced by 1. This operation is continued until the ROM memory cell array 20M_3 which is a last ROM memory cell array. Upon completion of the reading operation from the ROM memory cell array, the control circuit 4 sends a reading end signal to the power circuit 16. The power circuit 16 is set in a standby state, and the NOR type flash memory complies with a command from the user thereafter.

Next, a writing operation in the ROM memory cell array in the NOR type lash memory of the first embodiment will be described.

A case in which redundancy information stored when a defective memory cell is replaced with a redundant memory cell is written in the ROM memory cell array will be taken as an example. Based on a control signal, a ROM memory cell array for forcibly storing the redundancy information is selected. It is presumed that the sense amplifier of the sense amplifier and comparator circuit 19 for the ROM transfers 8-bit data all at once. Accordingly, writing of an 8-bit unit is carried out per address. The write data is controlled based on an address, an address (defect address) of a defective memory cell is entered from an address input pad of the pad 11, and data indicating the defective address is written in the selected ROM memory cell array.

Specifically, the control circuit 14 recognizes writing in the ROM memory cell array based on a write command and a test signal for the main body memory cell array. Upon establishment of the write command, the control circuit 14 instructs the power circuit 16 to set a writing voltage. The control circuit 14 waits for stabilization of the writing voltage, and then generates a writing pulse to execute writing.

Subsequently, a voltage for write verify is set, and the process waits for stabilization of the write verify voltage. After the stabilization of the verify voltage, the data written by the sense amplifier 19 is read from the ROM memory cell array, and the read data is compared with an expected value. If a result of the data comparison, i.e., a verifying result, is NG, a writing pulse is generated again in the NG memory cell after a writing voltage is set to execute writing. Then, write verify is carried out. Thus, writing and write verify are repeated until the data comparison result becomes OK. If the data comparison result is OK, the operation is finished after a reading voltage is set.

Next, erasing in the ROM memory cell array in the NOR type flash memory of the first embodiment will be described.

Erasing is permitted by each ROM memory cell array unit. As in the case of erasing in the main body cell array, this erasing includes the following three stages:
(1) preprogram;
(2) erase; and
(3) weak program An erasing operation for one ROM memory cell array will be described.

An operation of writing in al the memory cells of the ROM memory cell array is a preprogram, which is carried out as follows. The address buffer and counter 15 is reset, and after row and column addresses are set to head addresses, write verify is executed. If a verify result is NG, writing is executed to perform write verify again. Writing and write verify are repeated until the write verify becomes OK. When it becomes OK, the row and column addresses are advanced by 1 to similarly repeat writing and write verify. By repeating this operation until last addresses, writing is executed in all the memory cells of the ROM memory cell array.

Next, erasure is started. The address buffer and counter 15 is reset to set row and column addresses to head addresses, and then erase verify is carried out. Since it is immediately after the preprogram, a verifying result becomes NG to enter erasure. An erasing voltage is applied to all the memory cells in the ROM memory cell array. Erasure and erase verify are repeated until the erase verify becomes OK. When it becomes OK, the row and column addresses are advanced by 1. This is repeated until last row and column addresses to erase all the memory cells in the ROM memory cell array.

Then, a weak program is started. The address buffer and counter 15 is reset to set row and column addresses to head addresses, and then over erase verify is carried out. When there is an over erased memory cell (over erased cell), the over erase verify becomes NG, and weak writing is executed in the memory cell. Accordingly, a threshold of the over erased cell is increased to a verify voltage or higher. Then, weak writing and ever erase verify are repeated until the over erase verify becomes OK. When the over erase verify becomes OK, the addresses are advanced by 1. This is repeated until last addresses, and all the memory cells in the ROM memory cell array are set to thresholds equal to or higher than the over erase verify voltage.

When the weak writing is carried out, erase verify is executed again, and the erasing operation is finished if an erase verify result is OK. If an erase verify result is NG, erasure and weak writing are executed again until the erase verify result becomes OK.

As described above, for the reading, writing and erasing operations in the ROM memory cell array, operations similar to those of the main body memory cell can be performed. By arranging and arraying the ROM memory cell arrays, decoders, sense amplifiers, and driver circuits can be reduced, and an area for forming the decoders, the sense amplifiers and the driver circuits can be reduced. In other words, even when an increased memory capacity of the main body memory cell array enlarges a memory capacity of the ROM memory cell array, it is possible to suppress an increase in area for forming the decoders and the sense amplifiers of the ROM memory cell array associatively increased in number.

Figure 4:
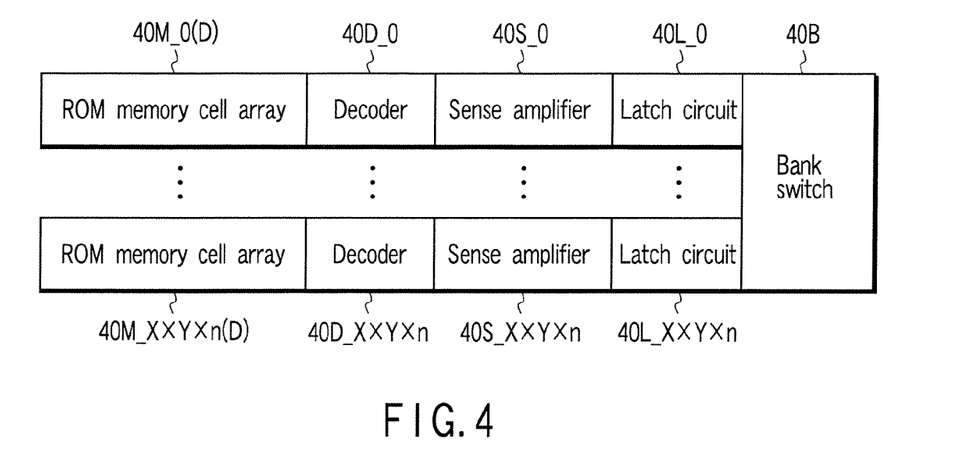
FIG. 4 is a block diagram showing a ROM memory cell array, a decoder, a sense amplifier, a latch circuit, and a bank switch in a conventional NOR type flash memory.

According to the first embodiment, the area can be reduced more as compared with the conventional case. This will be described below. FIG. 4 is a block diagram showing a configuration example of a ROM memory cell array, a decoder, a sense amplifier, a latch circuit and a bank switch in a NOR type flash memory. In the block diagram of FIG. 4, X×Y×n decoders 40D_0 to 40D_X×Y×n, and X×Y×n sense amplifiers 40S_0 to 40S_X×Y×n are disposed with respect to X×Y×n ROM memory cell arrays 40M_0 (D) to 40M_X×Y×n (D). In other words, one decoder and one sense amplifier are disposed for one ROM memory cell array. Each of the ROM memory cell arrays 40M_0 (D) to 40M_X×Y×n (D) includes D memory cells.

On the other hand, according to the first embodiment, n decoders and one sense amplifier are disposed for n ROM memory cell arrays 20M_0 to 20M_n. Each of the ROM memory cell arrays 20M_0 to 20M_n includes X×Y×D memory cells.

Thus, according to the first embodiment, while the number of memory cells is equal to that shown in the block diagram of FIG. 4, the numbers of decoders and sense amplifiers can be reduced to 1/(X×Y) as compared with the case shown in the block diagram of FIG. 4. For example, in the case of n ROM memory cell arrays constituted of 5 word lines, 8 bit lines and 8 data lines, n decoders and one sense amplifier only need to be disposed according to the first embodiment while 5×8×n decoders and sense amplifiers are disposed in the case shown in the block diagram of FIG. 4. Hence, according to the first embodiment, the numbers of decoders and sense amplifiers can respectively be reduced to 1/40 and 1/40n as compared with the conventional example of FIG. 4.

In the case of the NOR type flash memory of the first embodiment, even if redundancy replacement is automatically executed when a defective memory cell is generated in the main body memory cell array during an automatic erasing operation, the replacement operation can be carried out without any restrictions on a dual reading operation in the main body memory cell array. The dual reading operation is a function of permitting reading from the other bank while writing/erasing is executed in a certain bank.

Normally, two or more banks are disposed in many cases and, for example, when the ROM memory cell array and the main body memory cell array share a bank (bank switch), reading from the main body memory cell array which shares the bank is inhibited while writing is executed in the ROM memory cell array, and thus the dual reading operation is temporarily inhibited. According to the first embodiment, however, as the banks of the ROM memory cell array and the main body memory cell array are independently formed, it is possible to realize both of an automatic redundancy replacement operation and a dual reading operation.

SECOND EMBODIMENT

Next, a NOR type flash memory of a second embodiment of the present invention will be described. Sections similar to those of the first embodiment are denoted by similar reference numerals, and description thereof will be omitted.

Figure 5:
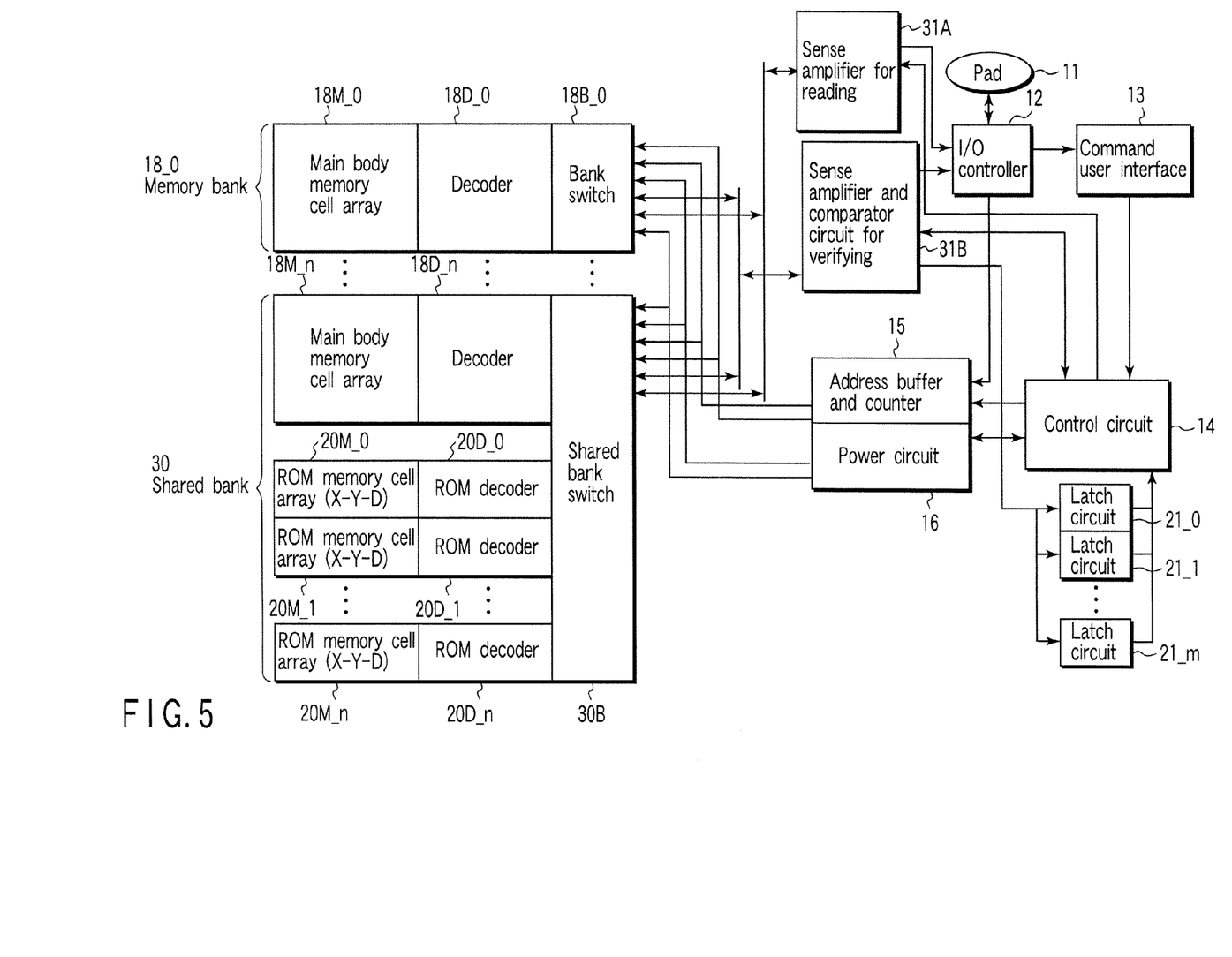
FIG. 5 is a block diagram showing a configuration of a NOR type flash memory according to a second embodiment of the present invention.

FIG. 5 is a block diagram showing a configuration of the NOR type flash memory of the second embodiment.

According to the second embodiment, a part of a main body memory cell array and a ROM memory cell array are constituted of the same bank. In other words, a part of the main body memory cell array and the ROM memory cell array share a bank switch, and a sense amplifier.

Specifically, as shown in FIG. 5, a shared bank 30 includes a main body memory cell array 18M_n, a decoder 18D_n, ROM memory cell arrays 20M_0, . . . , 20M_n, ROM decoders 20D_0, . . . , 20D_n, and a shared bank switch 30B. The decoder 18D_n is connected to the main body memory cell array 18M_n, and the ROM decoders 20D_0, . . . , 20D_n are connected to the ROM memory cell arrays 20M_0 (X–Y–D) to 20M_n (X–Y–D). The shared bank switch 30B is connected to the decoder 18D_n and the ROM decoders 20D_0 to 20D_n. Additionally, a sense amplifier 31A for reading, and a sense amplifier comparator circuit 31B for verifying are connected to bank switches 18B_0 to 18B_n and the shared bank switch 30B. Other components are similar to those of the first embodiment.

According to the second embodiment, as some circuits of the bank switches and the sense amplifiers can be shared by a part of the main body memory cell array and the ROM memory cell array, a chip area can be reduced. As an optional part of the main body memory cell arrays can be used as a ROM memory cell array, it is not necessary to form a new ROM memory cell array. Reading, writing and erasing operations are similar to those of the first embodiment.

According to the embodiment of the present invention, it is possible to provide a semiconductor memory device capable of suppressing an increase in chip area even when a memory capacity of a storage section for setting an initial operation and a function is increased.

The embodiments can be implemented independently but also in proper combination. Furthermore, the embodiments include various stages of inventions, and various stages of inventions can be derived from a proper combination of the plurality of components disclosed in the embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a first memory cell array which includes a plurality of memory cells;
   a first decoder which selects a memory cell from the first memory cell array based on an address;
   a second memory cell array which includes a plurality of memory cells;
   a second decoder which selects a memory cell from the second memory cell array based on an address;
   a first sense amplifier which reads data from the memory cell selected by one of the first decoder and the second decoder;
   a first switch circuit which switches the supply of writing and erasing voltages or a reading voltage to the first memory cell array, the first switch circuit switching the supply of writing and erasing addresses or a reading address to the first decoder, and switching the connection of a data line connected to a bit line of the first memory cell array to the first sense amplifier;
   a second switch circuit which switches the supply of writing and erasing voltages or a reading voltage to the second memory cell array, the second switch circuit switching the supply of writing and erasing addresses or a reading address to the second decoder, and switching the connection of a data line connected to a bit line of the second memory cell array to the first sense amplifier;
   a plurality of third memory cell arrays each of which includes pluralities of word and bit lines, and a plurality of memory cells arranged in a matrix at intersections of the word and bit lines, the plurality of third memory cell arrays storing setting information to set an initial operation and a function when power is turned ON;
   a plurality of third decoders which select the memory cells from the plurality of third memory cell arrays based on a predetermined signal output when the power is turned ON;
   a second sense amplifier which reads the setting information from the memory cells selected by the plurality of third decoders;
   a third switch circuit which switches the supply of writing and erasing voltages or a reading voltage to one of the plurality of third memory cell arrays, the third switch circuit switching the supply of writing and erasing addresses or a reading address to one of the plurality of third decoders, and switching the connection of a data line connected to a bit line of one of the plurality of third memory cell arrays to the second sense amplifier;
   a latch circuit which stores the setting information read by the second sense amplifier; and
   a control circuit which sets the initial operation and the function in accordance with the setting information stored in the latch circuit.

2. The semiconductor memory device according to claim 1, wherein:
   the first memory cell array includes a redundant memory cell,
   during an erasing operation, when a defect occurs in at least one of the memory cells of the first memory cell array, a defective memory cell is replaced with the redundant memory cell, and redundancy information indicating the replacement of the defective memory cell with the redundant memory cell is written as a part of the setting information in the plurality of third memory cell arrays.

3. The semiconductor memory device according to claim 1, wherein the first sense amplifier includes a reading sense amplifier, and a verifying sense amplifier,
   the reading sense amplifier reads data from the memory cell of the second memory cell array while the control circuit is writing or erasing data to or from the memory cell of the first memory cell array.

4. The semiconductor memory device according to claim 1, wherein the first sense amplifier reads data from the memory cell of the first memory cell array while the control circuit is writing or erasing data to or from the memory cell of the plurality of third memory cell arrays.

5. The semiconductor memory device according to claim 1, wherein the second sense amplifier executes serial reading by a plurality of times to read the setting information from the plurality of third memory cell arrays and to output the setting information to the latch circuit.

6. The semiconductor memory device according to claim 1, wherein the third switch circuit is arranged between the plurality of third decoders and the second sense amplifier.

7. The semiconductor memory device according to claim 1, wherein the setting information stored in the plurality of third memory cell arrays contains the redundancy information to replace a defective memory cell with the redundant memory cell, and protect information to protect data.

8. The semiconductor memory device according to claim 1, wherein the semiconductor memory device is a NOR type flash memory.

* * * * *